United States Patent
Jang et al.

(10) Patent No.: US 8,129,845 B2
(45) Date of Patent: Mar. 6, 2012

(54) SEMICONDUCTOR DEVICE AND METHOD OF FORMING INTERCONNECT STRUCTURE IN NON-ACTIVE AREA OF WAFER

(75) Inventors: TaeHoan Jang, Singapore (SG); JaeHun Ku, Singapore (SG); XuSheng Bao, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 194 days.

(21) Appl. No.: 12/207,324

(22) Filed: Sep. 9, 2008

(65) Prior Publication Data
US 2009/0079069 A1     Mar. 26, 2009

Related U.S. Application Data

(60) Provisional application No. 60/975,124, filed on Sep. 25, 2007.

(51) Int. Cl.
| H01L 23/12 | (2006.01) |
| H01L 23/48 | (2006.01) |
| H01L 23/52 | (2006.01) |
| H01L 29/40 | (2006.01) |

(52) U.S. Cl. ........ 257/776; 257/620; 257/738; 257/781; 257/E21.614; 257/E21.508; 257/E23.011; 257/E23.126; 438/110; 438/614

(58) Field of Classification Search .......... 438/106–110, 438/113, FOR. 369, FOR. 379, FOR. 384, 438/127, 584, 612, 613, 926, FOR. 343, FOR. 340, 438/FOR. 364; 257/620, 621, 737, 773, 257/776, E23.011, E23.126, E21.499, E21.502, 257/E21.503, E21.523, E21.59, E21.705, 257/734, 738, 772, 778, 779, 781, E23.023, 257/E23.01, E23.141, E23.168, E23.169, 257/E21.508, 684, E25.027, E21.512, E21.614
See application file for complete search history.

(56) References Cited

U.S. PATENT DOCUMENTS

| 4,703,559 | A  | * | 11/1987 | Ehrfeld et al. ................... 29/854 |
| 6,420,244 | B2 |   | 7/2002  | Lee |
| 6,717,245 | B1 |   | 4/2004  | Kinsman et al. |
| 6,852,607 | B2 |   | 2/2005  | Song et al. |
| 2001/0008794 | A1 | * | 7/2001 | Akagawa ....................... 438/620 |
| 2002/0090843 | A1 | * | 7/2002 | Chien ............................ 439/71 |
| 2003/0071354 | A1 |   | 4/2003 | Tsai et al. |
| 2005/0167798 | A1 | * | 8/2005 | Doan ............................ 257/678 |
| 2005/0200028 | A1 |   | 9/2005 | Farnworth et al. |

* cited by examiner

*Primary Examiner* — Julio J Maldonado
*Assistant Examiner* — Quovaunda V Jefferson
(74) *Attorney, Agent, or Firm* — Robert D. Atkins; Patent Law Group: Atkins & Associates, P.C.

(57) ABSTRACT

A semiconductor wafer includes a plurality of semiconductor die. Contact pads are formed on an active area of the semiconductor die and non-active area of the semiconductor wafer between the semiconductor die. Solder bumps are formed on the contact pads in both the active area of the semiconductor die and non-active area of the semiconductor wafer between the semiconductor die. The I/O terminal count of the semiconductor die is increased by forming solder bumps in the non-active area of the wafer. An encapsulant is formed over the solder bumps. The encapsulant provides structural support for the solder bumps formed in the non-active area of the semiconductor wafer. The semiconductor wafer undergoes grinding after forming the encapsulant to expose the solder bumps. The semiconductor wafer is singulated to separate the semiconductor die. The semiconductor die is mounted to a package substrate with solder paste or socket.

25 Claims, 8 Drawing Sheets

SEMICONDUCTOR DEVICE AND METHOD OF FORMING INTERCONNECT STRUCTURE IN NON-ACTIVE AREA OF WAFER

CLAIM TO DOMESTIC PRIORITY

The present nonprovisional application claims the benefit of priority of U.S. Provisional Application Ser. No. 60/975,124, filed Sep. 25, 2007, entitled "Encapsulated Bump WLCSP" by Tae Hoan Jang et al.

FIELD OF THE INVENTION

The present invention relates in general to semiconductor devices and, more particularly, to a semiconductor device and method of forming an interconnect structure in a non-active area of the wafer.

BACKGROUND OF THE INVENTION

Semiconductor devices are ubiquitous in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

Semiconductor die use a variety of interconnect structures to route signals between devices. Solder bumps are one common type of interconnect structure. Solder bumps are disposed over contact pads located in the active area of the die. However, the number of solder bumps that can be placed on the die is limited by the size of the active area and bump pitch. As semiconductor die become more complex and the active area reduces in size, the limited number of solder bumps that can be formed in the active area restricts the input/output (I/O) terminal count and interconnectivity of the die.

SUMMARY OF THE INVENTION

A need exits to increase the I/O terminal count for a semiconductor die. Accordingly, in one embodiment, the present invention is a method of making a semiconductor device comprising the steps of providing a semiconductor wafer having a plurality of semiconductor die, forming contact pads in an active area of the semiconductor die and non-active area of the semiconductor wafer between the semiconductor die, forming solder bumps on the contact pads in the active area of the semiconductor die and non-active area of the semiconductor wafer between the semiconductor die, forming an encapsulant over the solder bumps, singulating the semiconductor wafer to separate the semiconductor die, and mounting the semiconductor die to a package substrate.

In another embodiment, the present invention is a method of making a semiconductor device comprising the steps of providing a semiconductor wafer having a plurality of semiconductor die, forming contact pads in a non-active area of the semiconductor wafer between the semiconductor die, forming an interconnect structure on the contact pads in the non-active area of the semiconductor wafer between the semiconductor die, and forming an encapsulant over the interconnect structure.

In another embodiment, the present invention is a method of making a semiconductor device comprising the steps of providing a semiconductor wafer having a plurality of semiconductor die, forming an interconnect structure in a non-active area of the semiconductor wafer between the semiconductor die, and forming an encapsulant over the interconnect structure.

In another embodiment, the present invention is a semiconductor device comprising a semiconductor wafer including a plurality of semiconductor die. An interconnect structure is formed in a non-active area of the semiconductor wafer between the semiconductor die. An encapsulant is formed over the interconnect structure.

DETAILED DESCRIPTION OF THE DRAWINGS

Figure 1:
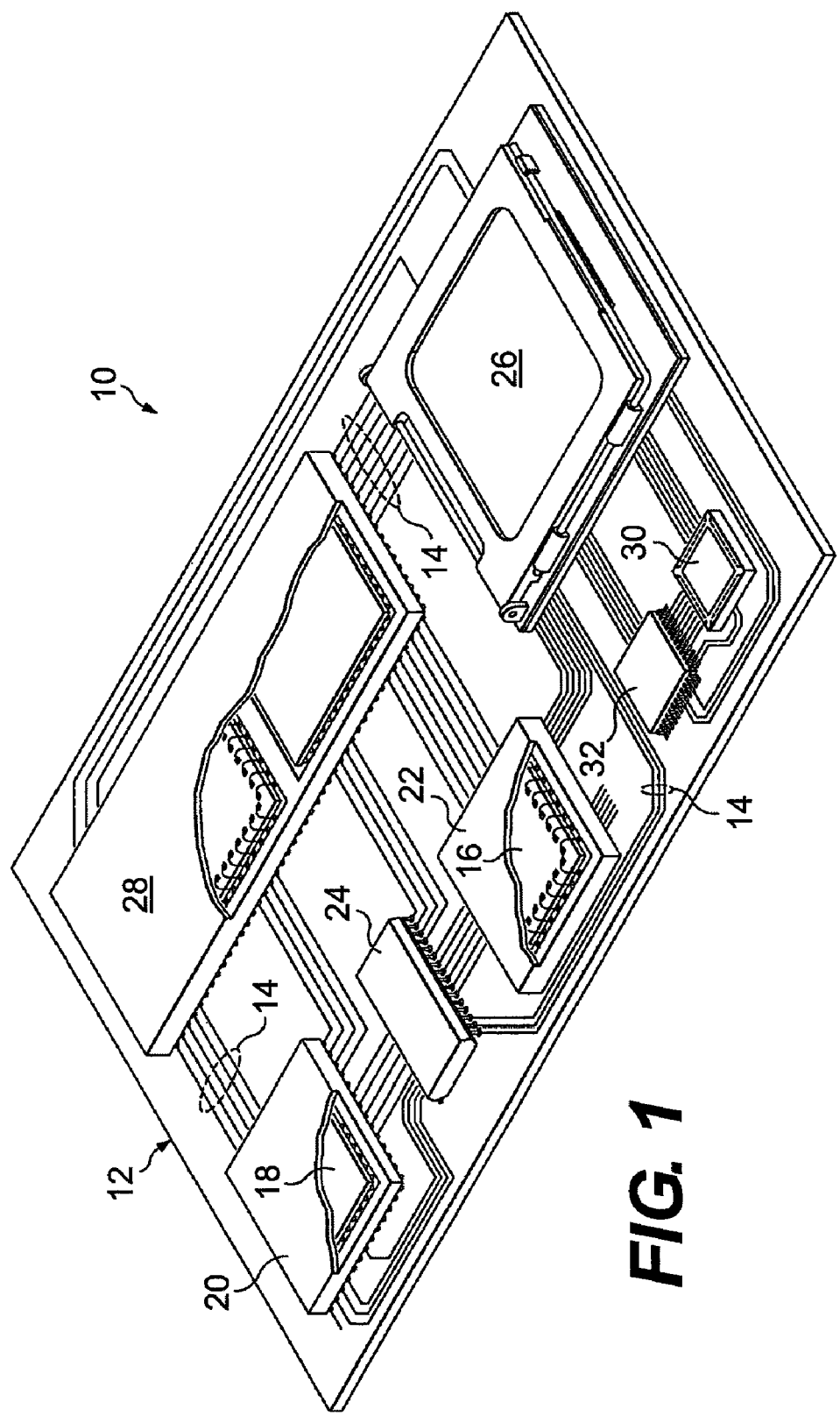
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components which are electrically connected to form circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, thin film deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by thin film deposition. The type of material being deposited determines the thin film deposition technique. The thin film deposition techniques include chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Some types of materials are patterned without being etched; instead patterns are formed by directly depositing the material into the areas or voids formed by a previous deposition/etch process using techniques such as electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is the technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically attached directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
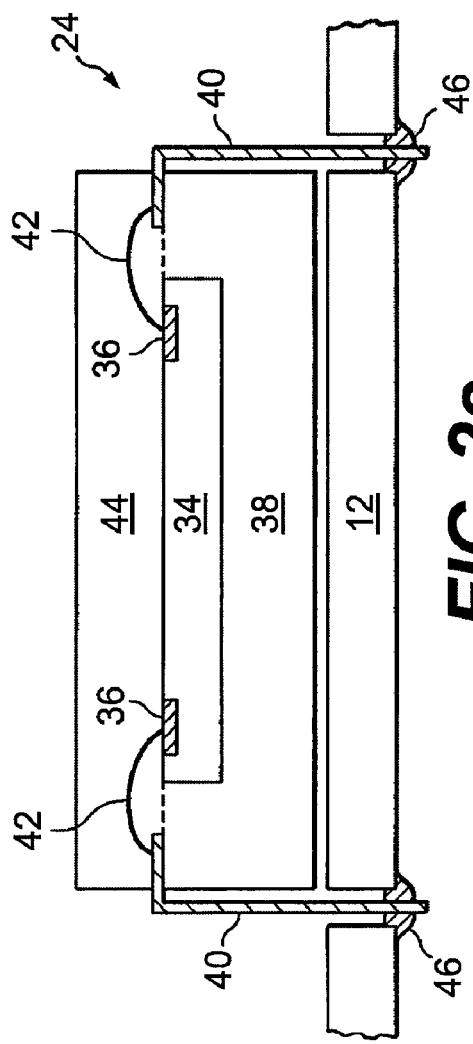
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active area containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active area of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as plastic or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
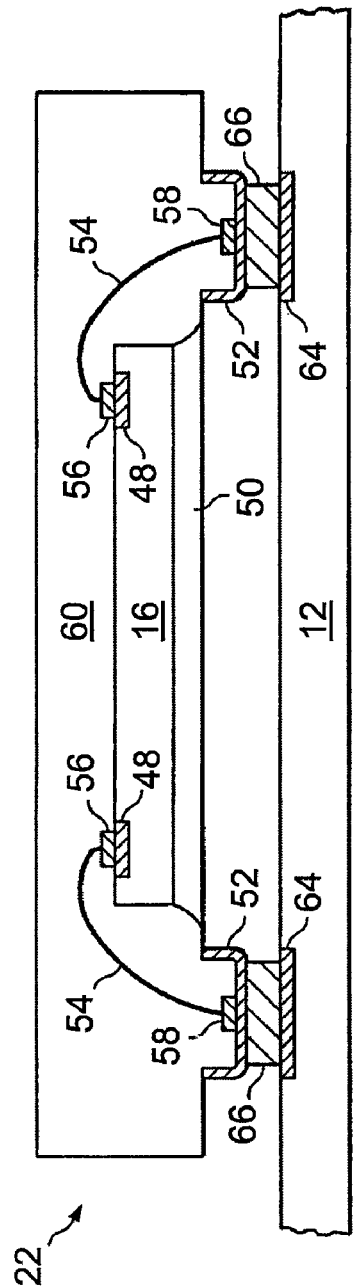

FIG. 2b illustrates further detail of BCC 22 mounted on PCB 12. Semiconductor die 16 is connected to a carrier by wire bond style first level packaging. BCC 22 is mounted to PCB 12 with a BCC style second level packaging. Semiconductor die 16 having contact pads 48 is mounted over a carrier using an underfill or epoxy-resin adhesive material 50. Semiconductor die 16 includes an active area containing analog or digital circuits implemented as active devices, passive devices, conductive layers, and dielectric layers formed within semiconductor die 16 and are electrically interconnected according to the electrical design of the die. For example, the circuit may include one or more transistors, diodes, inductors, capacitors, resistors, and other circuit elements formed within the active area of die 16. Contact pads 48 are made with a conductive material, such as Al, Cu, Sn, Ni, Au, or Ag, and are electrically connected to the circuit elements formed within die 16. Contact pads 48 are formed by PVD, CVD, electrolytic plating, or electroless plating process. Wire bonds 54 and bond pads 56 and 58 electrically connect contact pads 48 of semiconductor die 16 to contact pads 52 of BCC 22 forming the first level packaging. Molding compound or encapsulant 60 is deposited over semiconductor die 16, wire bonds 54, contact pads 48, and contact pads 52 to provide physical support and electrical isolation for the device. Contact pads 64 are formed on a surface of PCB 12 using evaporation, electrolytic plating, electroless plating, screen printing, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
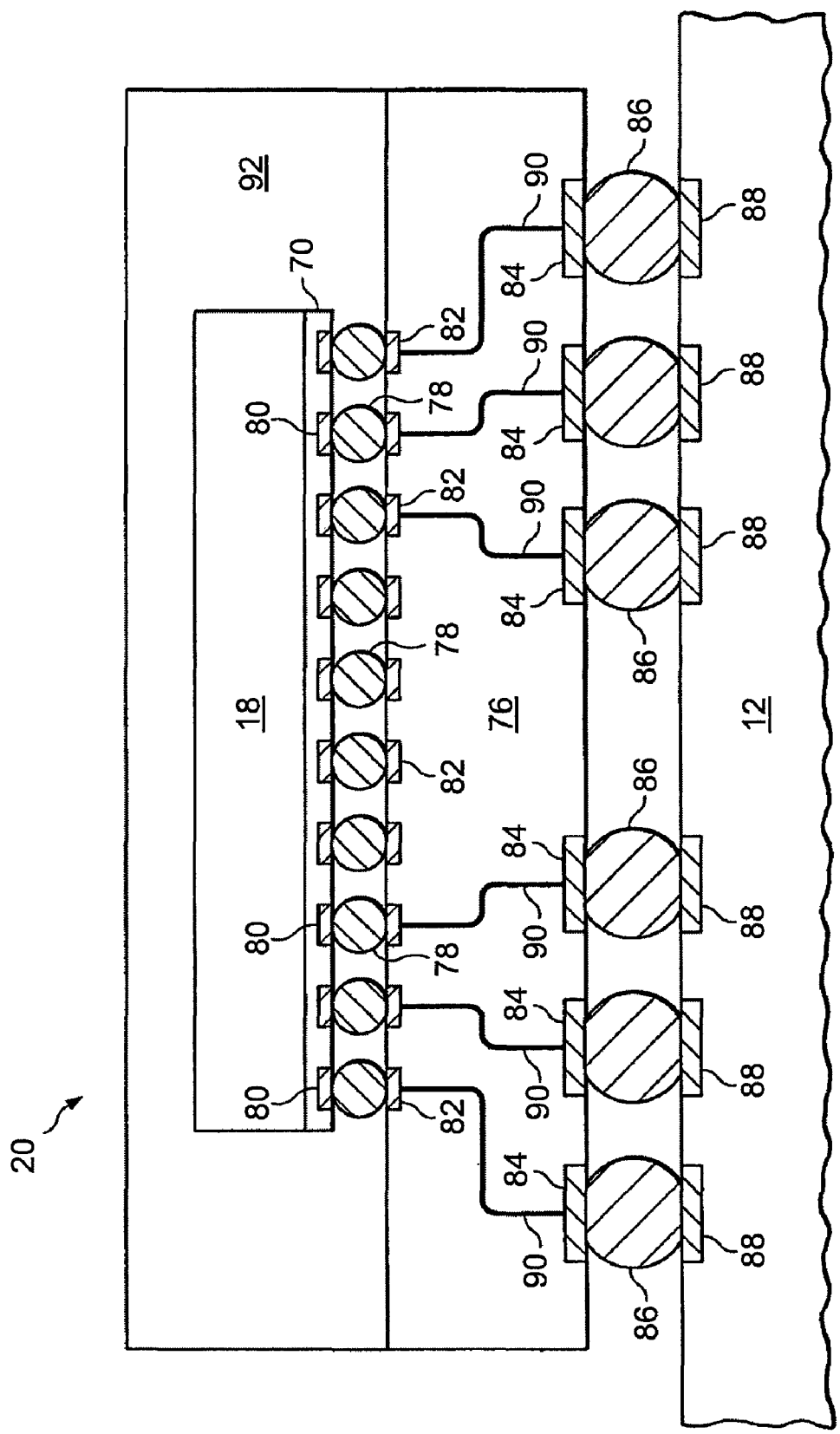

In FIG. 2c, semiconductor die 18 is mounted face down to carrier 76 with a flip chip style first level packaging. BGA 20 is attached to PCB 12 with a BGA style second level packaging. Active area 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active area 70 of semiconductor die 18. Semiconductor die 18 is electrically and mechanically attached to the carrier 76 through a large number of individual conductive solder bumps or balls 78. Solder bumps 78 are formed on bump pads or interconnect sites 80, which are disposed on active areas 70. Bump pads 80 are made with a conductive material, such as Al, Cu, Sn, Ni, Au, or Ag, and are electrically connected to the circuit elements formed in active area 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3A:
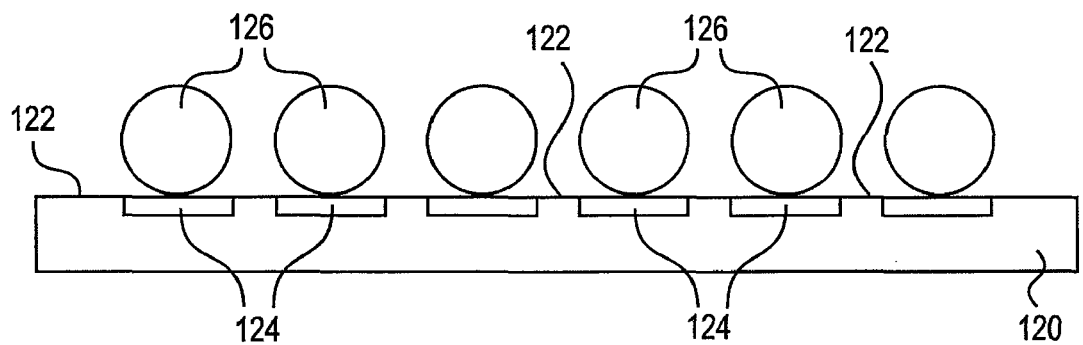
FIGS. 3a-3e illustrate a process of forming solder bumps in a non-active area of a semiconductor wafer.

FIGS. 3a-3e illustrate a method of making a wafer level chip scale package (WLCSP) with an interconnect structure formed in a non-active area of the wafer. FIG. 3a illustrates a semiconductor wafer 120 made with silicon, germanium, gallium arsenide, or other bulk semiconductor material. Wafer 120 includes a plurality of semiconductor die each having active and passive devices, integrated passive devices (IPD), conductive layers, and dielectric layers formed on active surface 122 according to the electrical design of the die.

In particular, a metal layer is deposited over wafer 120 using an evaporation, electrolytic plating, electroless plating, or screen printing process to form contact pads 124. Contact pads 124 can be titanium (Ti), Ni, nickel vanadium (NiV), Cu, or Cu alloy. Contact pads 124 are formed both in active area 122 and in the non-active area between the semiconductor die. Contact pads 124 connect to conductive layers in active surface 122 to provide the electrical interconnect for each semiconductor die.

An electrically conductive solder material is deposited over contact pads 124 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 126. In some applications, solder bumps 126 are reflowed a second time to improve electrical contact to contact pads 124.

Figure 3B:
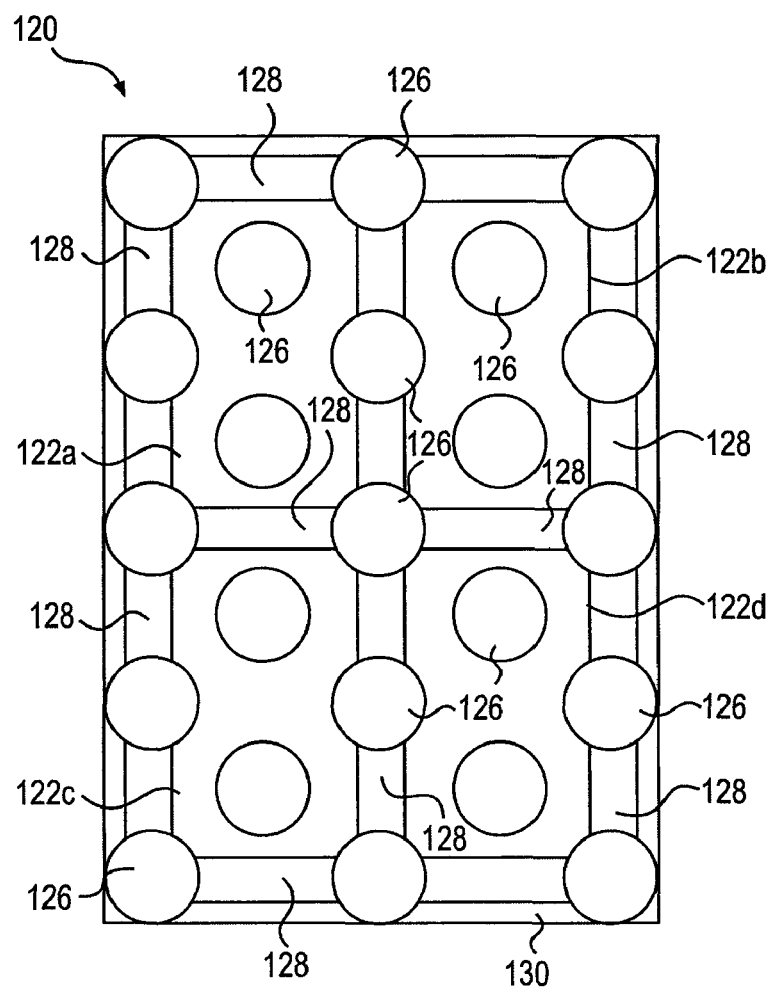

FIG. 3b shows a top view of a portion of semiconductor wafer 120. Active area 122a-122d represent the individual semiconductor die of wafer 120 separated by non-active area or saw streets 128. The non-active area 128 is a non-electrically functional area of the wafer between the semiconductor die. A typical wafer contains hundreds or thousands of semiconductor die 122a-122d. Some solder bumps 126 are disposed within active area 122; other solder bumps 126 are formed over non-active area 128. Thus, solder bumps 126 are formed both in active area 122 and in non-active area 128. In the prior art, all solder bumps are completely contained with the active area of the die. By placing solder bumps 126 over the non-active area 128, the solder bump density and interconnect count can be increased, i.e., more solder bumps can be formed over a given wafer area.

Other interconnect structures, such as conductive posts and pillars and wire bond sites, can be disposed in non-active area 128.

An encapsulant or molding compound 130 is deposited over active area 122a-122d and solder bumps 126 using a printing, compressive molding, transfer molding, liquid encapsulant molding, or other suitable applicator. Encapsulant 130 can be epoxy resin, epoxy acrylate, polymer, or polymer composite material. Encapsulant 130 is non-conductive and environmentally protects the semiconductor device from external elements and contaminants. The bump-side of wafer 120 undergoes grinding to expose solder bumps 126 and reduce the profile and thickness of the wafer and final package.

Figure 3C:
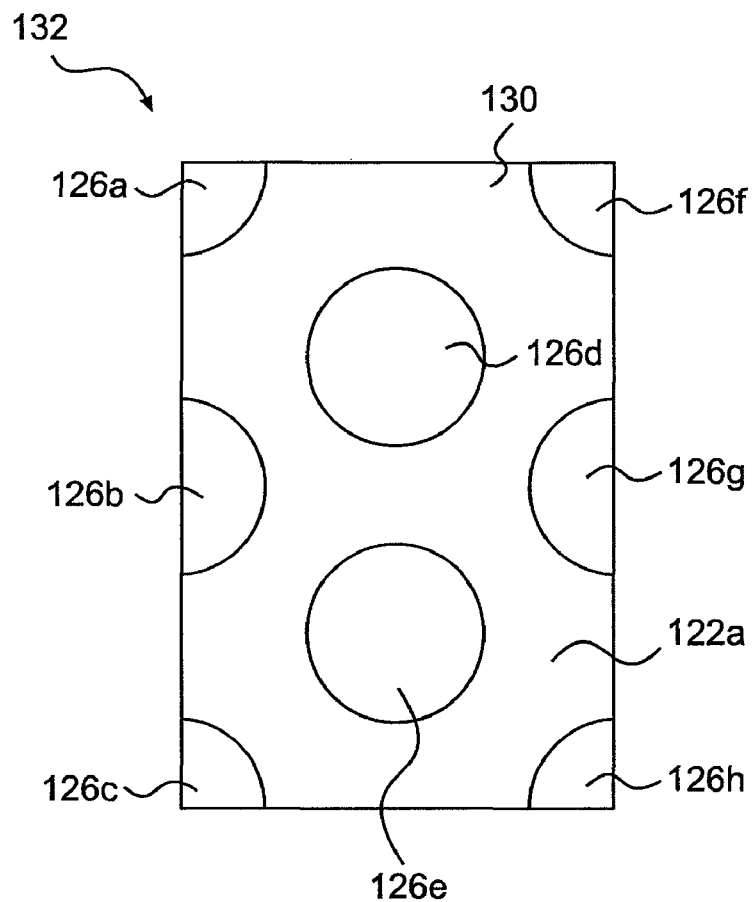
Figure 3D:
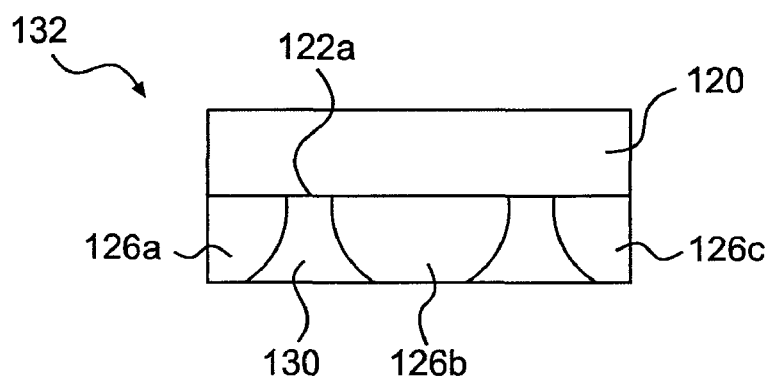

Semiconductor wafer 120 is singulated along non-active area 128 using a laser cutting tool or saw blade in FIG. 3c. Semiconductor die 132 includes active area 122a and solder bumps 126a-126h. Solder bumps 126b and 126g are half-area bumps due to the wafer singulation cut in one direction through the bumps. Solder bumps 126a, 126c, 126f, and 126h are quarter-area bumps due to the wafer singulation cut in two directions through the bumps. Encapsulant 130 provides protection and structural support for solder bumps 126a-126h during singulation and subsequent mounting to the print circuit board (PCB). FIG. 3d shows a cross-sectional view of semiconductor die 132 with exposed solder bumps 126a-126c.

Figure 3E:
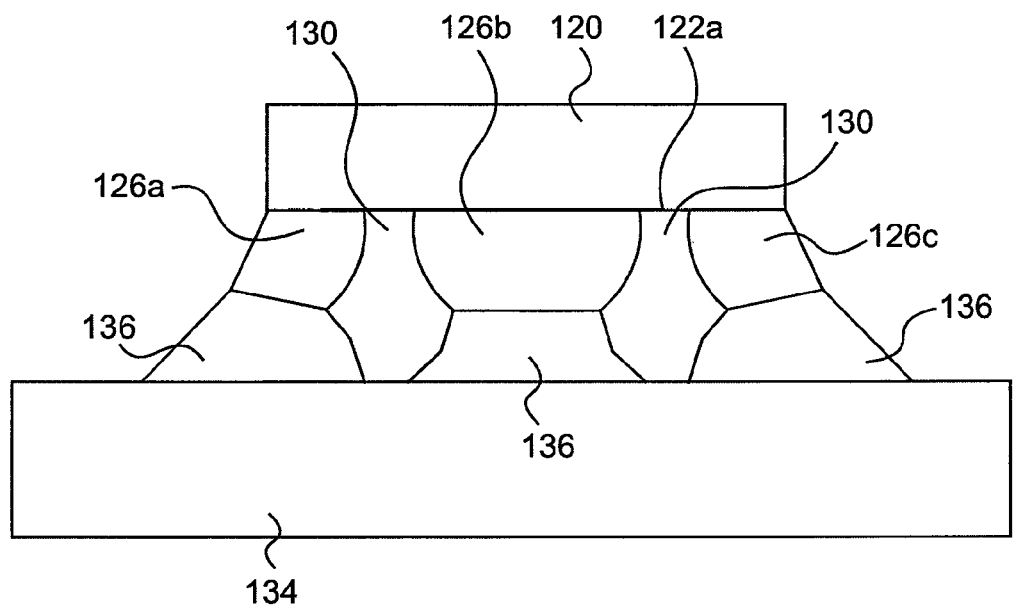

In FIG. 3e, semiconductor die 132 is mounted to a package substrate or PCB 134 which includes pins or contact pads for interconnection with other electronic components. Solder bumps 126 are electrically and metallurgically connected to PCB 134 with solder paste 136 using screen printing process.

Figure 4A:
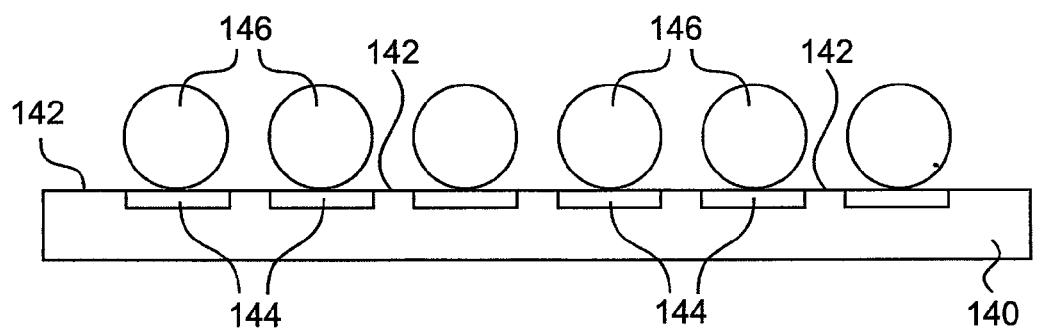
FIGS. 4a-4e illustrate an alternate process of forming solder bumps in the non-active area of the semiconductor wafer.

FIGS. 4a-4d illustrate an alternate method of making a WLCSP with an interconnect structure formed in a non-active area of the wafer. FIG. 4a illustrates a semiconductor wafer 140 made with silicon, germanium, gallium arsenide, or other bulk semiconductor material. Wafer 140 includes a plurality of semiconductor die each having active and passive devices, IPD, conductive layers, and dielectric layers formed on active surface 142 according to the electrical design of the die.

In particular, a metal layer is deposited over wafer 140 using an evaporation, electrolytic plating, electroless plating, or screen printing process to form contact pads 144. Contact pads 144 can be Ti, Ni, NiV, Cu, or Cu alloy. Contact pads 144 are formed at least in the non-active area between the semiconductor die. Contact pads can also be formed in active area 142. Contact pads 144 connect to conductive layers in active surface 142 to provide the electrical interconnect for each semiconductor die.

An electrically conductive solder material is deposited over contact pads 144 using an evaporation, electrolytic plating, electroless plating, ball drop, or screen printing process. The solder material can be metal or electrically conductive material, e.g., Sn, Pb, Ni, Au, Ag, Cu, Bi, and alloys thereof. For example, the solder material can be eutectic Sn/Pb, high lead, or lead free. The solder material is reflowed by heating the solder material above its melting point to form solder bumps 146. In some applications, solder bumps 146 are reflowed a second time to improve electrical contact to contact pads 144.

Figure 4B:
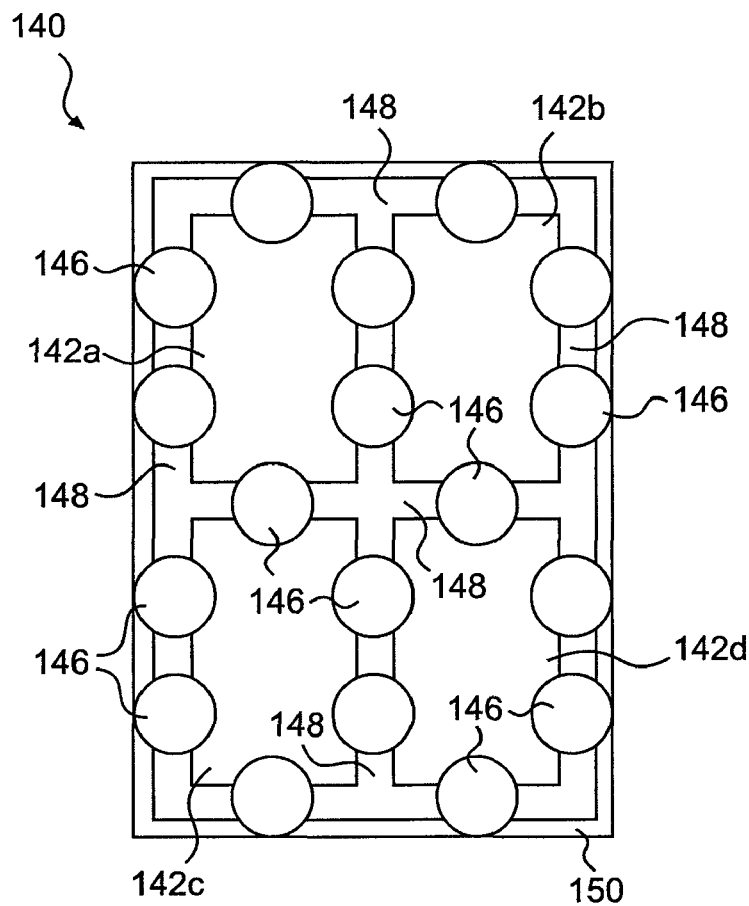

FIG. 4b shows a top view of a portion of semiconductor wafer 140. Active area 142a-142d represent the individual semiconductor die of wafer 140 separated by non-active area or saw streets 148. The non-active area 148 is a non-electrically functional area of the wafer between the semiconductor die. A typical wafer contains hundreds or thousands of semiconductor die 142a-142d. FIG. 4b shows solder bumps 146 disposed at least in non-active area 148. Solder bumps 146 can also be formed in active area 142. By placing solder bumps 146 over the non-active area 148, the solder bump density and interconnect density can be increased, i.e., more solder bumps can be formed over a given wafer area.

Other interconnect structures, such as conductive posts and pillars and wire bond sites, can be disposed in non-active area 148.

An encapsulant or molding compound 150 is deposited over active area 142a-142d and solder bumps 146 using a printing, compressive molding, transfer molding, liquid encapsulant molding, or other suitable applicator. Encapsulant 150 can be epoxy resin, epoxy acrylate, polymer, or polymer composite material. Encapsulant 150 is non-conductive and environmentally protects the semiconductor device from external elements and contaminants.

Figure 4C:
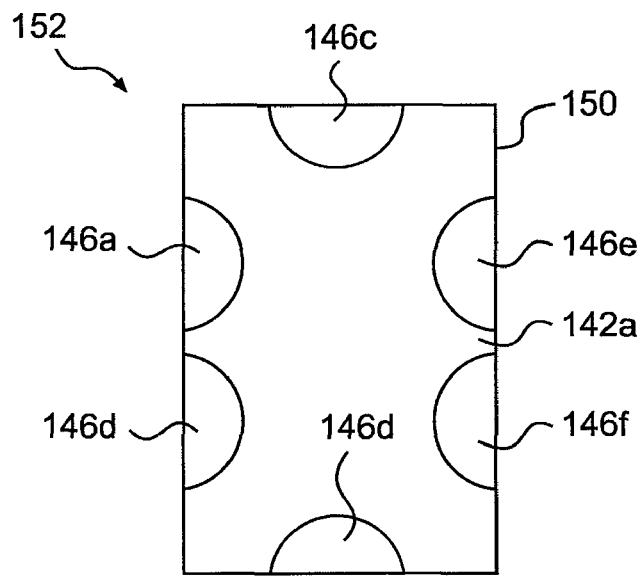
Figure 4D:
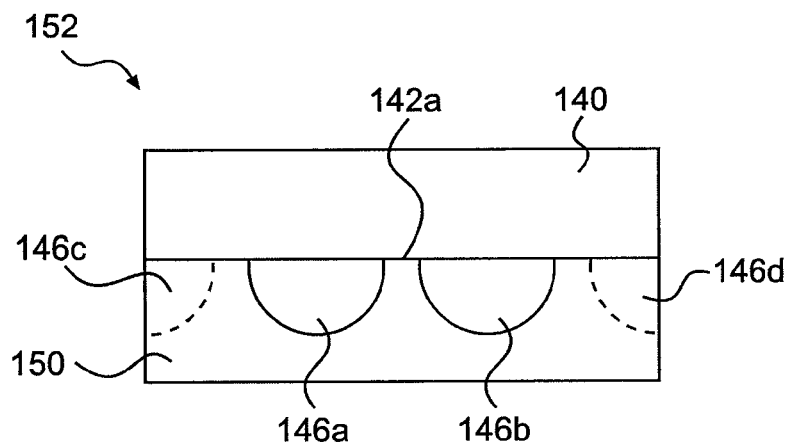

Semiconductor wafer 140 is singulated along non-active area 148 using a laser cutting tool or saw blade in FIG. 4c. Semiconductor die 152 includes active area 142a and solder bumps 146a-146f. Solder bumps 146a-146f are half-area bumps due to the wafer singulation cut in one direction through the bumps. Encapsulant 150 provides protection and structural support for solder bumps 146a-146f during singulation and subsequent mounting to the PCB. FIG. 4d shows a cross-sectional view of semiconductor die 152 with solder bumps 146a-146d.

Figure 4E:
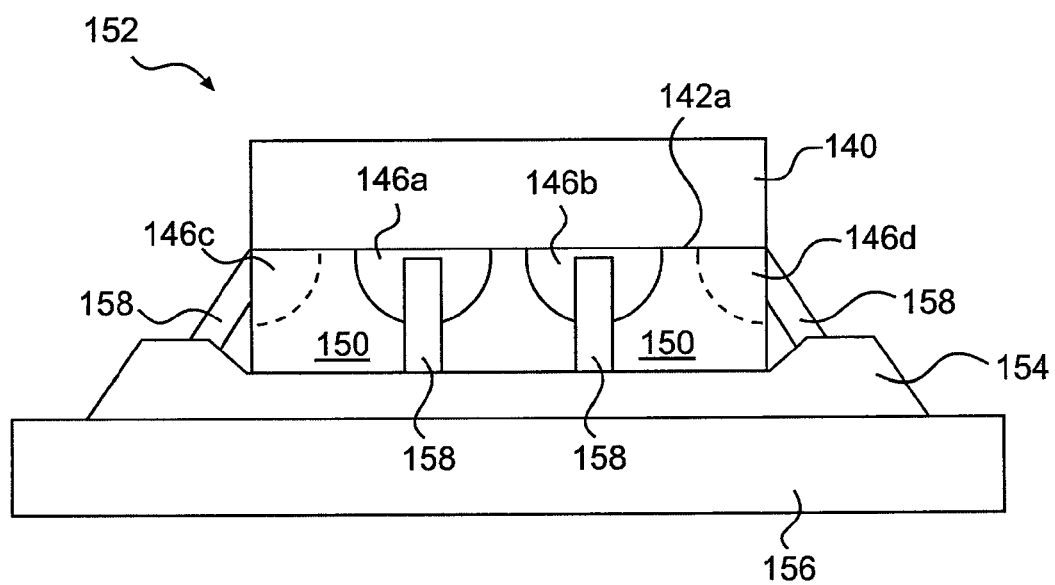

In FIG. 4e, semiconductor die 152 is mounted to a socket base 154 on package substrate or PCB 156. PCB 156 includes pins or contact pads for interconnection with other system components. Solder bumps 146 are electrically and mechanically connected to socket pins or electrodes 158 on socket base 154.

In summary, the semiconductor wafer includes solder bumps disposed in the non-active area of the wafer, as well as in the active area of the die. By placing the solder bumps over the non-active area of the wafer, the solder bump density and interconnect count can be increased, i.e., more solder bumps can be formed over a given wafer area. An encapsulant or molding compound is deposited over the active area of the die and solder bumps. The encapsulant provides protection and structural support for the solder bumps during singulation and subsequent mounting to the PCB.

While one or more embodiments of the present invention have been illustrated in detail, the skilled artisan will appreciate that modifications and adaptations to those embodiments may be made without departing from the scope of the present invention as set forth in the following claims.

What is claimed is:

1. A method of making a semiconductor device, comprising:
    providing a semiconductor wafer having a plurality of semiconductor die;
    forming contact pads in an active area of the semiconductor die and in a non-active area of the semiconductor wafer between the semiconductor die;
    forming conductive bumps on the contact pads in the active area of the semiconductor die and in the non-active area of the semiconductor wafer between the semiconductor die;
    forming an encapsulant over the conductive bumps;
    singulating the semiconductor wafer to separate the semiconductor die; and
    mounting the semiconductor die to a package substrate.

2. The method of claim 1, wherein the encapsulant provides structural support for the conductive bumps formed in the non-active area of the semiconductor wafer between the semiconductor die.

3. The method of claim 1, further including mounting the semiconductor die to the package substrate with solder paste.

4. The method of claim 1, further including:
    providing a socket base on the package substrate;
    mounting the semiconductor die to the socket base; and
    electrically connecting the conductive bumps to electrodes on the socket base.

5. The method of claim 1, further including grinding the semiconductor wafer after forming the encapsulant to expose the conductive bumps.

6. A method of making a semiconductor device, comprising:
    providing a semiconductor wafer having a plurality of semiconductor die;
    forming contact pads in a non-active area of the semiconductor wafer between the semiconductor die;
    forming an interconnect structure on the contact pads in the non-active area of the semiconductor wafer between the semiconductor die; and
    forming an encapsulant over the interconnect structure.

7. The method of claim 6, wherein the interconnect structure includes conductive bumps, conductive posts, or wire bond sites.

8. The method of claim 6, further including forming the interconnect structure in the active area of the semiconductor die.

9. The method of claim 6, further including:
    singulating the semiconductor wafer to separate the semiconductor die; and
    mounting the semiconductor die to a package substrate.

10. The method of claim 6, wherein the encapsulant provides structural support for the interconnect structure formed in the non-active area of the semiconductor wafer between the semiconductor die.

11. The method of claim 6, further including mounting the semiconductor die to the package substrate with solder paste.

12. The method of claim 6, further including:
    providing a socket base on the package substrate;
    mounting the semiconductor die to the socket base; and
    electrically connecting the interconnect structure to electrodes on the socket base.

13. The method of claim 6, further including grinding the semiconductor wafer after forming the encapsulant to expose the interconnect structure.

14. A method of making a semiconductor device, comprising:
    providing a semiconductor wafer having a plurality of semiconductor die;
    forming an interconnect structure in a non-active area of the semiconductor wafer between the semiconductor die; and
    forming an encapsulant over the interconnect structure.

15. The method of claim 14, further including:
    forming contact pads in the non-active area of the semiconductor wafer between the semiconductor die; and
    forming the interconnect structure on the contact pads in the non-active area of the semiconductor wafer between the semiconductor die.

16. The method of claim 14, wherein the interconnect structure includes conductive bumps, conductive posts, or wire bond sites.

17. The method of claim 14, further including:
    singulating the semiconductor wafer to separate the semiconductor die; and
    mounting the semiconductor die to a package substrate.

18. The method of claim 14, wherein the encapsulant provides structural support for the interconnect structure formed in the non-active area of the semiconductor wafer between the semiconductor die.

19. The method of claim 14, further including mounting the semiconductor die to the package substrate with solder paste.

20. The method of claim 14, further including:
    providing a socket base on the package substrate;
    mounting the semiconductor die to the socket base; and
    electrically connecting the interconnect structure to electrodes on the socket base.

21. The method of claim 14, further including grinding the semiconductor wafer after forming the encapsulant to expose the interconnect structure.

22. A semiconductor device, comprising:
    a semiconductor wafer including a plurality of semiconductor die;
    an interconnect structure formed in a non-active area of the semiconductor wafer between the semiconductor die; and
    an encapsulant formed over the interconnect structure.

23. The semiconductor device of claim 22, further including a plurality of contact pads formed on the non-active area of the semiconductor wafer between the semiconductor die, the interconnect structure being formed on the contact pads in the non-active area of the semiconductor wafer between the semiconductor die.

24. The semiconductor device of claim 22, wherein the interconnect structure includes conductive bumps, conductive posts, or wire bond sites.

25. The semiconductor device of claim 22, wherein the encapsulant provides structural support for the interconnect structure formed in the non-active area of the semiconductor wafer between the semiconductor die.

* * * * *